(12) United States Patent
Buttner et al.

(10) Patent No.: US 9,406,014 B2
(45) Date of Patent: Aug. 2, 2016

(54) TOP GATED METHOD FOR MANUFACTURING A DATA CARRIER

(75) Inventors: Bernhard Buttner, Germering (DE); Thomas Tarantino, Laufen (DE); Robert Griesmeier, OT Heufeldmuhle (DE)

(73) Assignee: GIESECKE & DEVRIENT GMBH, Munich (DE)

( * ) Notice: Subject to any disclaimer, the term of this patent is extended or adjusted under 35 U.S.C. 154(b) by 58 days.

(21) Appl. No.: 14/126,595

(22) PCT Filed: Jun. 14, 2012

(86) PCT No.: PCT/EP2012/002531
§ 371 (c)(1),
(2), (4) Date: Dec. 16, 2013

(87) PCT Pub. No.: WO2012/171649
PCT Pub. Date: Dec. 20, 2012

(65) Prior Publication Data
US 2014/0117098 A1  May 1, 2014

(30) Foreign Application Priority Data

Jun. 17, 2011  (DE) .......................... 10 2011 104 510

(51) Int. Cl.
*G06K 19/077* (2006.01)
*B29C 45/14* (2006.01)
(Continued)

(52) U.S. Cl.
CPC .... *G06K 19/07732* (2013.01); *B29C 45/14647* (2013.01); *B29C 45/2708* (2013.01);
(Continued)

(58) Field of Classification Search
CPC ................... G06K 19/07732; G06K 19/07724
USPC ....................................................... 235/492
See application file for complete search history.

(56) References Cited

U.S. PATENT DOCUMENTS 6,444,501 B1 * 9/2002 Bolken .......................... 438/127
7,220,615 B2 * 5/2007 Bolken .......................... 438/106
(Continued)

FOREIGN PATENT DOCUMENTS

DE       10227936 C1    5/2003
DE     102004028218 A1  1/2006
(Continued)

OTHER PUBLICATIONS

DE Search Report corresponding to German Application No. DE102011104510.8, mailed May 9, 2012.
(Continued)

*Primary Examiner* — Toan Ly
(74) *Attorney, Agent, or Firm* — Workman Nydegger (57) ABSTRACT

A method for manufacturing a portable data carrier includes the steps of: providing a carrier band having an upper side and a lower side disposed opposite the upper side including a contact field formed with at least one contact area; arranging a semiconductor circuit on the lower side of the carrier band and electroconductively connected with the corresponding contact area; and carrying out an injection molding process on the lower side a potting compound formed around the semiconductor circuit and having outer dimensions according to a portable data carrier standard specification. An injection channel for injecting the potting compound is arranged on a side of the potting compound mold parallel to the lower side, and after the injection of the potting compound a depression remains in the finished data carrier due to the injection channel. A portable data carrier includes the features and is used as a subscriber identity module.

15 Claims, 5 Drawing Sheets

(51) Int. Cl.
    *B29C 45/27*     (2006.01)
    *H01L 21/56*     (2006.01)
    *H01L 23/00*     (2006.01)
    *B29C 45/37*     (2006.01)

(52) U.S. Cl.
    CPC .... *G06K19/07724* (2013.01); *G06K 19/07743* (2013.01); *H01L 21/565* (2013.01); *H01L 24/97* (2013.01); *B29C 45/372* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01); *H01L 2224/97* (2013.01); *H01L 2924/12042* (2013.01); *H01L 2924/181* (2013.01); *H01L 2924/1815* (2013.01)

(56) References Cited

U.S. PATENT DOCUMENTS

| | | | |
|---|---|---|---|
| 7,293,716 B1 * | 11/2007 | Miks | 235/492 |
| 8,087,591 B2 | 1/2012 | Waschk | |
| 2007/0152071 A1 * | 7/2007 | Jow | 235/492 |
| 2008/0135625 A1 | 6/2008 | Waschk | |
| 2011/0101105 A1 | 5/2011 | Grundwurmer et al. | |

FOREIGN PATENT DOCUMENTS

| | | | | |
|---|---|---|---|---|
| DE | 102008005320 A1 | | 7/2009 | |
| DE | 102011100070 A1 | | 10/2012 | |
| DE | 102011112031 A1 | | 11/2012 | |
| EP | 0482419 A1 | | 4/1992 | |
| GB | 2490501 A | * | 11/2012 | G06K 19/077 |

OTHER PUBLICATIONS

Golem.de, "Nokia Booklet 3G—the expensive UMTS-country skiers," URL: http://www.golem.de/0911/71399.html, downloaded on Dec. 13, 2013.

International Search Report corresponding to International PCT Application No. PCT/EP2012/002531, mailed Sep. 26, 2012.

* cited by examiner

Fig. 1 - State of the Art

Fig 2 – State of the Art

Fig 3 – State of the Art

TOP GATED METHOD FOR MANUFACTURING A DATA CARRIER

BACKGROUND

The invention relates to a method for manufacturing a portable data carrier, in particular a chip card, as well as a portable data carrier and the employment of the data carrier as subscriber identity module, briefly (U)SIM. In particular, the invention relates to the manufacture of chip cards with outer dimensions smaller than the standard dimensions standardized at the time of the application.

SUMMARY

In the ISO/IEC 7816-2 standard the dimensions are defined for the smallest form factor, the so-called 3FF or "micro SIM" or "mini plug-in". This 3FF standard has the outer dimensions of approximately 12 mm×15 mm. In the ISO/IEC 7816-2 standard additionally the minimum size, the number and exact position of the contact areas of the contact field of chip cards are described.

According to DE 10 2004 028 218 A1, a manufacturing method for data carriers is known in which a carrier band, also referred to as foil carrier, is provided. On an upper side of the carrier band a contact field with individual contact areas is formed. Subsequently a semiconductor circuit is arranged on a lower side disposed opposite the upper side, and is electrically connected with the contact areas of the upper side. Finally, the semiconductor circuit on the lower side is encapsulated by means of a potting compound. This takes place preferably in an injection molding process. The potting compound here already has the outer dimensions of the outer dimensions correspondingly described in the standard specification for the outer dimensions of a portable data carrier. Reference is made explicitly here to the complete disclosure of DE 10 2004 028 218 A1. Herein, the portable data carrier is communicatively connected with the terminal via the physical interface of a contact field for the exchange of data. It is a general trend that these terminals are continuously becoming smaller, more compact and are equipped with greater functionality. Due to the increasing miniaturization of mobile communication terminals and the ever-increasing functional capability of these devices, it is desirable to also reduce the size of the portable data carriers operated in the terminal. This required area is not reduced along with the further miniaturization of the terminals, however, so that the overall size of the terminals is strongly influenced by the standardized sizes of the data carriers.

In view of an increasing miniaturization of mobile communication terminals and an increasing functionality of the communication terminals, a continuous need for the further reduction in size of the standard for SIM chip cards referred to as "mini plug-in" is to be expected and desirable.

There is further a need for the data carriers to remain operable in older communication terminals or in terminals that require a different form factor for SIM cards, thus making it desirable to maintain the contact field standardized in accordance with ISO/IEC 7816-2 also for future form standards. The smallest conceivable area which a data carrier should have in the future is consequently the area of the contact field.

With a manufacturing method according to DE 10 2004 028 218 A1 it is possible to form card bodies which do not exceed the area of the contact field or in which the edge of the contact field has a smaller distance to the edge area of the data carrier body than the hitherto defined standards for data carriers in accordance with ISO/IEC 7816. When a semiconductor circuit is molded in by means of a potting compound, it must be ensured that the finished data carrier can be removed from the potting compound mold quickly and easily. Therefore flank angles between the side area and the upper side of the data carrier are employed that are larger than zero degrees, in particular 10 degrees. Through the slight beveling of the flanks the data carrier can be removed more easily and quickly from the potting compound mold.

In today's ISO/IEC 7816 standard particularly the corner radiuses of the data carrier and the flank angle between the side area and the upper side of the data carrier are strictly predetermined, so that a uniform construction type of the standards is given. It must thus be assumed that a standardization of a form factor smaller than the 3FF standard is also subject to these limitations. From DE 10 2004 028 218 A1 it cannot be gathered how these requirements for corner radiuses and flank angles are actually met.

A further problem relates to the handling of the data carrier itself. When the data carrier is incorporated as intended a in a terminal for data exchange, it is usually fixed in the terminal in a mechanically detachable fashion, for example by clamping, locking or insertion or generally by holding the data carrier. The handling of the data carrier in the 3FF format is difficult in particular when changing the data carriers in the terminal, due to the small dimensions. If the data carrier is further miniaturized, this handling will be further complicated.

It is consequently the object of the invention to manufacture a data carrier which can be handled more easily and which corresponds to the specifications of a future standard nonetheless.

The object of the invention is achieved by the measures described in the coordinated independent patent claims. Advantageous embodiments are described in the respective dependent claims.

In particular the object is achieved by a method for manufacturing a portable data carrier, in particular a chip card. The inventive method comprises the steps of: Providing a carrier band with an upper side and a lower side disposed opposite the upper side, wherein on the upper side a contact field is formed which has at least one contact area; arranging a semiconductor circuit on the lower side of the carrier band, wherein the semiconductor circuit is electroconductively connected with the corresponding contact area; and executing an injection molding process in such a fashion that on the lower side a potting compound is formed around the semiconductor circuit, wherein said potting compound has the outer dimensions according to a standard specification of a portable data carrier. The method is characterized in that after injecting the potting compound a depression remains in the finished data carrier on a side of the data carrier body that is parallel to the lower side.

The term depression refers to any regional dip of the data carrier on the side of the data carrier body that is parallel to the lower side. This can be a transversally or longitudinally guided groove, a geometric figure, for example a circle or an ellipse or also a different structure.

By this method a depression is arranged on the lower side of the data carrier in an advantageous fashion. This depression more easily enables a user to handle the data carrier. In particular when incorporating or removing the data carrier from a holder in a terminal, where the data carrier is incorporated as intended, to enter into data exchange with the terminal, the depression makes it possible to change the data carrier. The depression makes it possible for example for a user to remove the data carrier from the holder by means of his fingernail or a corresponding object.

It is particularly advantageous when the injection channel for injecting the potting compound is arranged on the side of the potting compound mold that is parallel to the lower side of the carrier band, whereby the depression is obtained. The injection in this fashion is also referred to as top gating by the skilled public.

In particular the depression is arranged in the center of the data carrier and uneven areas are contained in an inner region of the depression. Despite the uneven areas the data carrier body does not have a height that exceeds the maximum height of the data carrier body described in accordance with the standard specification. These uneven areas better enable the user to handle the data carrier, in particular upon changing the data carrier in a terminal.

It is particularly advantageous when the potting compound is a first potting compound, and the semiconductor circuit is already encapsulated by a second potting compound prior to the injection molding process. The second potting compound is then of a material that differs from the first potting compound. The second potting compound can thus have a larger flank angle and a larger corner radius, so that the manufacturing process at the chip manufacturer can remain unchanged. However, to meet the prescriptions of a form standardization, the data carrier is subsequently insert molded again with a different material. This material of the first potting compound has improved flow properties, so that a smaller corner radius is achieved by a different viscosity. The material can further have a weaker degree of curing and lesser stability, so that steeper flank angles are achieved. The material of the first potting compound can thus be formed more easily.

To improve the singling of the data carrier the carrier band is pre-punched in such a fashion that upon singling the data carriers less carrier band material is severed. Thereby, less mechanical stress is exerted on the data carrier upon singling, thereby preventing a delamination between the carrier band and the potting compound.

The data carrier is electrically personalized in a personalization unit before a singling step, whereby an individualization of the data carrier takes place. In particular, the data carrier is optically personalized before a singling step.

Advantageously, the data carrier is singled by separating the portion of the carrier band that is connected with the potting compound from the rest of the carrier band.

The idea of the invention further encompasses a portable data carrier for contact-type data exchange with a terminal. The data carrier has a carrier band with an upper side and a lower side disposed opposite the upper side, with a contact field having at least one contact area being formed on the upper side; a semiconductor circuit on the lower side, the semiconductor circuit being connected electroconductively with the at least one contact area; and a data carrier body of a potting compound material, with the potting compound surrounding the semiconductor circuit. The potting compound has the outer dimensions according to a standard specification of a portable data carrier. The finished data carrier body has a depression on a side parallel to the lower side.

The data carrier is employed preferably as subscriber identification module for use in a terminal as intended. For this purpose the subscriber identification module has the functionalities as described in the technical specifications ETSI TS 102 221 and ETSI TS 102 671 as so-called universal integrated circuit cards, abbreviated as UICC. The outer contour of the subscriber identification module is metal-free by the exception of the upper side.

The portable data carrier according to the invention is preferably a data carrier with corresponding security functionalities, such as e.g. smart cards, chip cards, tokens and/or subscriber identification cards in a mobile communication network, to gain access to secured areas or services through corresponding authentication, e.g. to applications of a mobile communication provider provided via a mobile communication network. It is also possible that the subscriber identification module is incorporated as a fixed component in the data carrier as an M2M module.

Hereinafter the invention and further embodiments and advantages of the invention will be explained more closely with reference to figures, the figures merely describing embodiment examples of the invention. The same components in the figures are provided with the same reference signs. The figures are not to be considered true to scale; individual elements of the figures can be shown with an exaggerated size or exaggerated simplicity.

DETAILED DESCRIPTION OF VARIOUS EMBODIMENTS

Figure 1:
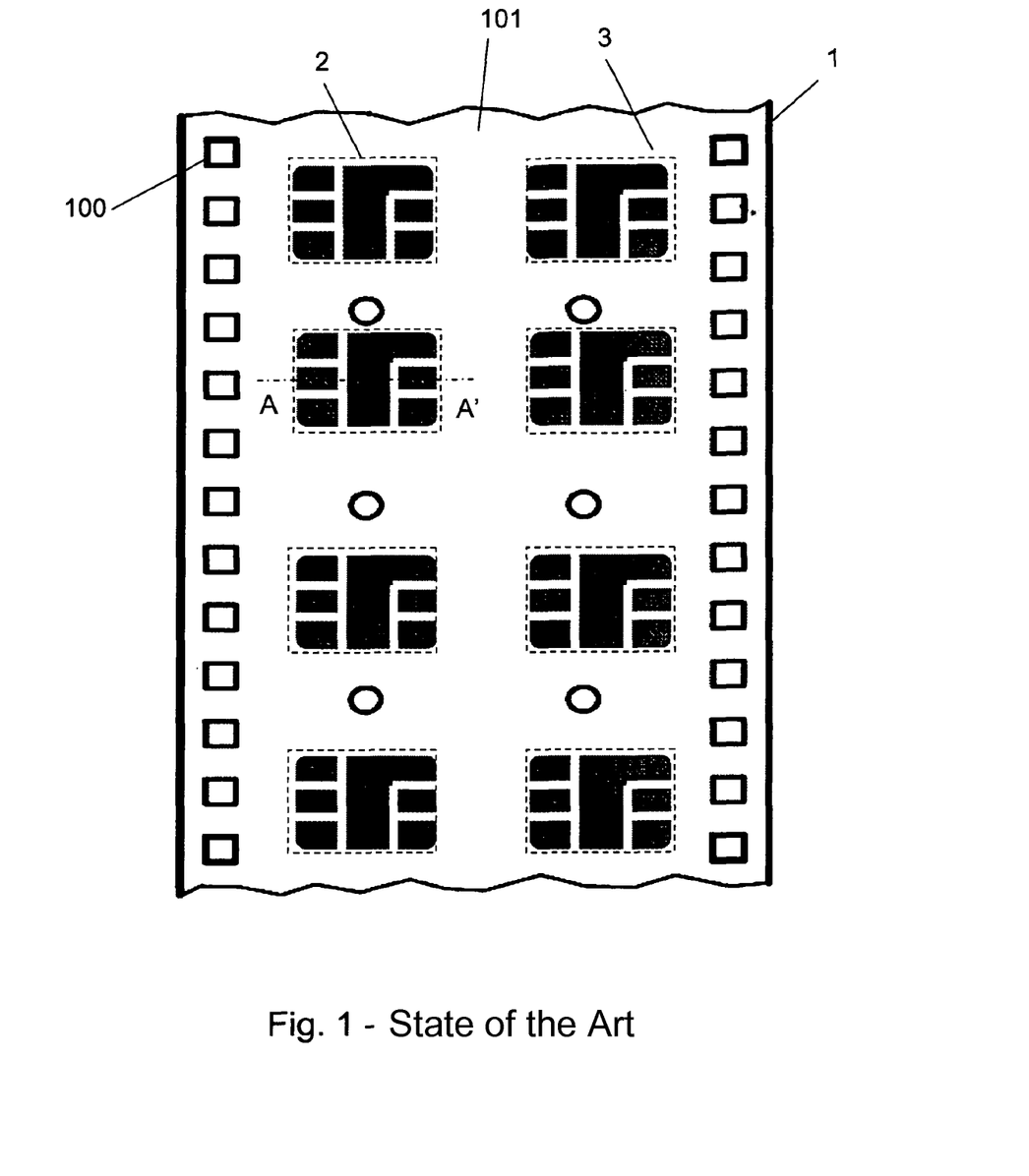
FIG. 1 A carrier band for manufacturing a portable data carrier with formed contact areas according to the state of the art FIG. 2 A cross section of a data carrier according to the state of the art before insert molding along the sectional line A-A' of FIG. 1

In FIG. 1 a portion of a carrier band 1 is represented in plan view of an upper side 101 from the state of the art. The band 1 is the starting material for the manufacturing method according to the invention. The carrier band 1 is for example a foil carrier of a rollable carrier material on plastic basis and/or FR4 basis, thus a glass-fiber reinforced epoxide laminate, having perforations 100 on the sides to support transport during the processing. Likewise, contact fields 2 on the upper side 101 are represented On the opposite lower side 102 of the carrier band 1 the data carrier body 3 with the integrated semiconductor circuit 4 is arranged, which is indicated by a dash line here.

To form the contact fields 2 on the upper side 101 an electrochemical method, namely electroplating, is applied. The contact fields 2 herein correspond to a standard layout for chip cards according to ISO/IEC 7816.

Figure 2:
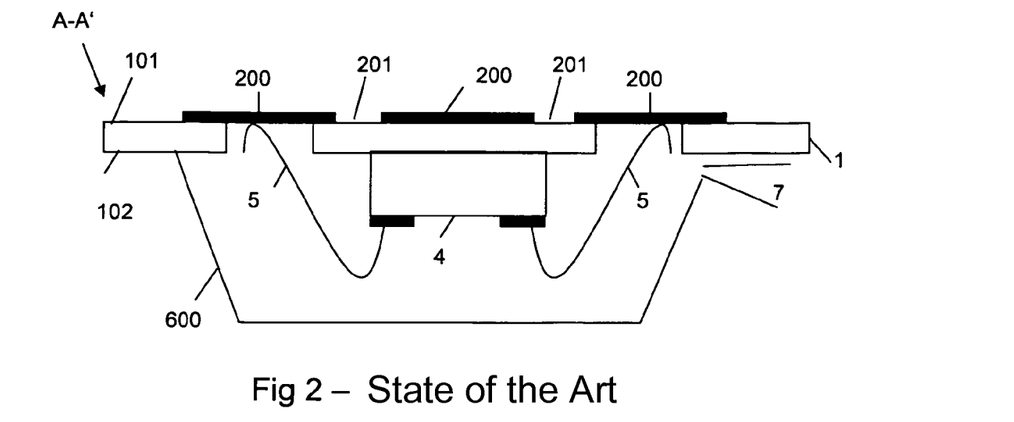

In FIG. 2 a cross section of a data carrier according to the state of the art is represented before insert molding along the sectional line A-A' of FIG. 1. The data carrier has a carrier band 1, on whose upper side 101 contact areas 200 and corresponding sectional lines 201 between the contact areas are formed, thereby electrically isolating or separating the contact areas 200 from each other. On the lower side 102 of the carrier band a semiconductor circuit 4 is arranged that is connected with corresponding contact areas 200 via electro-conductive connections 5. The forming of the connections 5 takes place either in wire bond technology, as shown here, or in a not represented flip-chip technology.

Conventionally, a potting compound mold 600 is arranged around the semiconductor circuit 4, said mold being intended to give the data carrier its final shape. This mold has an injection channel 7 disposed on a side that is orthogonal to the carrier band. Preferably the injection channel is arranged in the vicinity of the carrier band 1. The potting compound 6, which is to make up the data carrier body 4, is injected through the injection channel 7. It surrounds the complete semiconductor chip 4 and the electric connections 5.

The semiconductor circuit 4 is a "chip" that is usual for chip cards, i.e. an integrated circuit produced by processing a wafer, said integrated circuit usually having all features of a limited-resource computer. The manufacture of the chip and likewise the preparation of the carrier band 1 by applying the contact layout, contacting areas and the chip are known to the skilled public and are described in detail among other things in the books "Vom Plastik zur Chipkarte" ("From plastic to the chip card") or also in the book "Handbuch der Chipkarten" ("Handbook of chip cards") by W. Rankl, W. Effing, Hanser Verlag, 4$^{th}$ edition. For details on carrying out the processing steps and on the structure and function of the integrated circuit therefore reference is made to the relevant literature, in particular the mentioned books.

Figure 3:
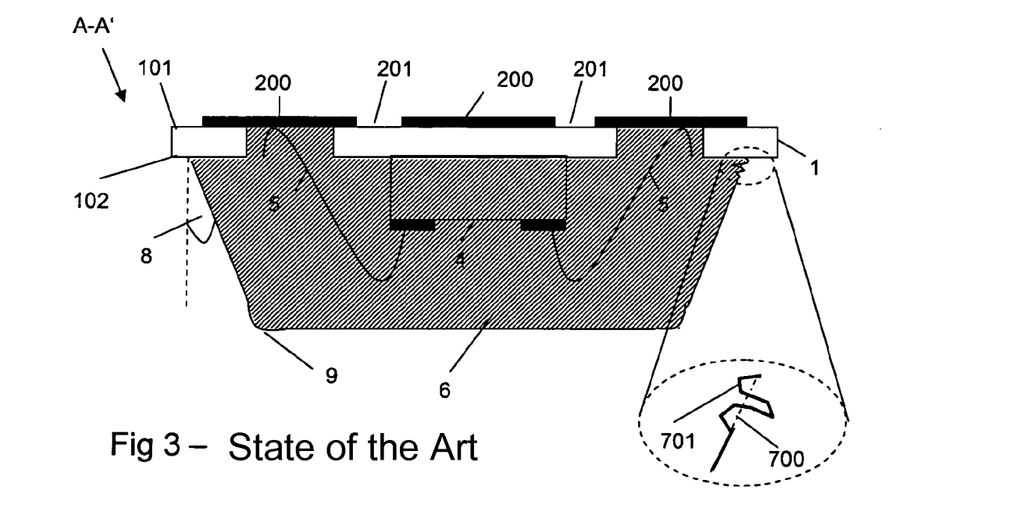
FIG. 3 A cross section of a data carrier according to the state of the art after insert molding along the sectional line A-A' of FIG. 1

FIG. 3 shows the data carrier of FIG. 2 at the sectional line A-A' of FIG. 1 after the injection molding process. Due to the properties and condition of the potting compound 6 the corner radiuses 9 are very large. Also the flank angles 8 are larger than zero degrees. Further, a flash is disposed in the region of the injection channel 7, said flash resulting from the injection process. In an enlargement of the flash location it can be recognized that the actual shape 701 deviates from the ideal shape 700 of the potting compound mold 600. In such a lateral injection process, also referred to as degating, it cannot be ruled out that the resulting flash is formed beyond the boundaries of the potting compound mold, so that the maximum size of the data carrier is exceeded.

Since corresponding future standards could prescribe that both the flank angle and the corner radius must be reduced and the flash must be removed, further manufacturing steps are required to manufacture the data carrier so that it conforms to standards.

Figure 4:
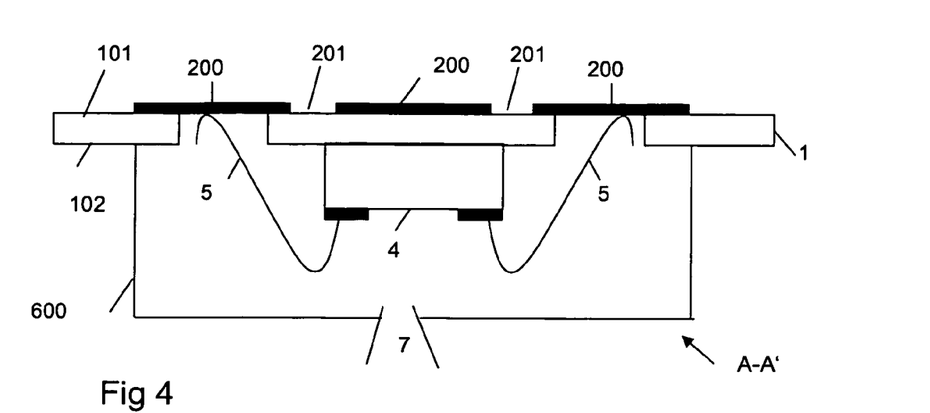
FIG. 4 A cross section of a data carrier according to the invention before insert molding along the sectional line A-A'
Figure 5:
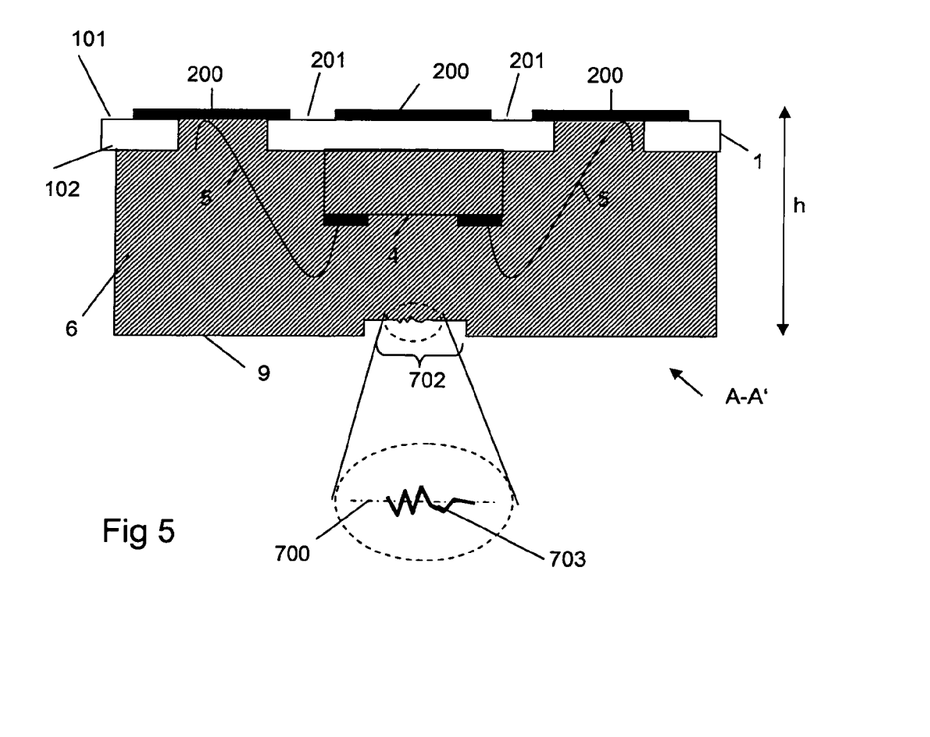
FIG. 5 A cross section of a data carrier according to the invention after insert molding FIG. 6 A cross section of a data carrier according to the invention after insert molding, manufactured in an alternative fashion FIG. 7 A cross section of a data carrier according to the invention after insert molding during the step of singling FIG. 8 An embodiment example of a depression according to the invention

In FIGS. 4 and 5 a first method according to the invention for manufacturing a data carrier is represented. On the lower side 102 of the carrier band 1 a potting compound mold 600 is arranged which will form a data carrier body 3 with the outer dimensions of the standard specifications. It is ensured in the process that the flank angle 8 has zero degrees and also the corner radiuses 9 are substantially reduced, in particular are much smaller than in the conventional manufacturing method. The substantial difference to the manufacturing methods according to FIGS. 2 and 3 is the arrangement of the injection channel 7 for the potting compound 6. This method is called topgating and, in the present atypical application, surprisingly has the effect that a depression 702 results which has substantial advantages with regard to the handling of the data carrier.

In FIG. 5 now the data carrier described in FIG. 4 is represented after the injection process. From the topgating, i.e. the arrangement of the injection channel 7 on a side of the data carrier body 3 that is parallel to the lower side 102 of the carrier band 1, the depression 702 results. It can be gathered from an enlarged representation that uneven areas 703 are contained within the depression 700. By this depression 702 and the uneven areas 703 contained therein it is made much easier for the user to remove the data carrier from the terminal or to incorporate it in the terminal.

The data carrier here has a formed contact field 2 with six or seven contact areas 200. The data carrier body 3 has a substantially smaller surface than the embodiment of a data carrier hitherto specified in accordance with the 3FF standard. The contact areas 200 are electrically isolated from each other, which is indicated by the separating line 201. Such a miniaturized data carrier in accordance with FIGS. 4 and 5 is for example described in DE 10 2011100 070, filed by the applicant with the GPTO on 29 Apr. 2011, or in DE 10 2011101 297, filed by the applicant with the GPTO on 11 May 2011. The configuration of the contact field 2 with a seventh contact area C9, which requires an additional separating line 201, is also described there. The contact area C9 is in particular useful when one wishes to exchange data with a terminal using a plurality of different communication protocols, for example USB, ISO, SWP. The assignment of the contacts and the wiring can also be gathered from the mentioned applications.

Further, the shape of the data carriers manufactured in FIGS. 4 and 5 conforms with future standards, since the flank angle 8 and the corner radius 9 are already adapted to current standards. In particular, the height h of the data carrier body is smaller or equal to the height agreed according to the standard.

The tool to be employed for the injection molding process consists of two mold halves, with the lower mold half lying against the upper side of the carrier band 1 and serving as base. The upper mold half rests tightly on the lower side of the carrier band 1, surrounding, while leaving a cavity, the semiconductor circuit 6 with contacting areas C1-C9 and possibly further contacting structures present, for example in the form of bonding wires. The cavity surrounded by the upper mold half has the final shape desired for the finished portable data carrier, if required corrected by a height deduction for the thickness d of the carrier band 1. The final shape of the data carrier body 3 can in particular be a geometry with the standard dimensions as discussed possibly in the future by ETSI as a new format.

The thus already largely finished portable data carrier is individualized subsequently. For this purpose the chip card body 3 with the semiconductor circuit 4 embedded therein is brought to a testing and personalization device. Said device has in particular a reading/writing device with contact pins which rest against the contact areas 200 to establish a data connection with the semiconductor circuit 4. Via this data connection the semiconductor circuit 4 is then checked in the usual fashion and subsequently provided with individualizing data by writing e.g. a serial number.

The tested and individualized portable data carrier is subsequently supplied to an inscribing station, where it is inscribed e.g. by means of a laser or by printing with an ink jet printer or equipped with graphical elements. The steps of the data-related individualization and the subsequent inscription expediently take place on the roll, i.e. while the potting compound 6 is still connected with the carrier band 1. The perforations 100 here make a simple movement of the carrier band 1 possible.

The individualized data carrier is then singled. By means of a suitable tool, e.g. a punching tool, here the portions of the carrier band 1 located outside the potting compound are removed. The portion of the carrier band 1 that is connected with the potting compound 6 remains on the potting compound 6 and becomes the cover layer of the finished portable data carrier. As an alternative to punching, the removal of the carrier band 1 can also take place by cutting, by using a laser or by chemical singling. The singling step can also take place at an earlier stage, i.e. before the inscription or before the individualization in the personalization device. The execution of the further processing steps can then take place e.g. in the "tray", i.e. a kind of tray with depressions in which the data carriers are located individually.

Figure 6:
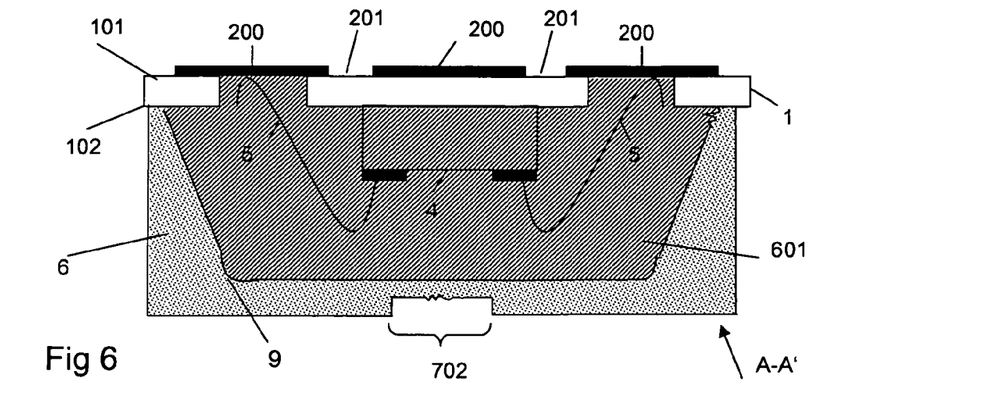

In FIG. 6 a manufacturing method is shown which is an alternative to that of FIGS. 4 and 5. Here the semiconductor chip 4 is initially encapsulated by a second potting compound 601. It must be taken into account that the dimensions of the second potting compound are smaller than the outer dimensions required by the standard for a standardized data carrier. The first potting compound is now arranged around the second potting compound 601 according to the method described in FIGS. 4 and 5. It is well recognizable in FIG. 6 that the first potting compound 6 has a much smaller flank angle 8, in particular smaller than 5 degrees, and a smaller corner radius 9. Also the flash resulting from the degating is encapsulated by the topgating procedure. The depression 702 represented according to FIG. 6 serves the improved handling by a user of the data carrier. It is advantageous here that the outer potting compound can have different material properties with regard to stability, viscosity and degree of curing in comparison to the inner potting compound, for which reason the second material can be more inexpensive in particular.

Figure 7:
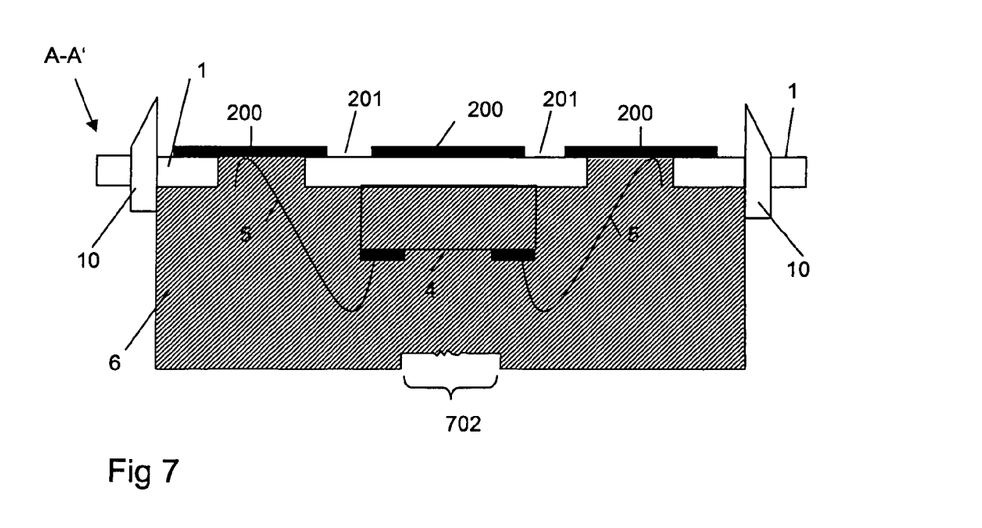

In FIG. 7 in turn an alternative manufacturing method is represented. Instead of the second encapsulation of the semiconductor circuit 4, the data carrier is provided with larger outer dimensions in comparison to the standard specification. To improve the flank angles 8, the corner radiuses 9 and for the purpose of singling, the data carrier is not only singled from the carrier band 1, but also the potting compound is trimmed upon singling. For this purpose a cutting tool 10 or a punching tool is used. Alternatively, the final shape can also be produced by lasering or by means of a chemical process.

Figure 8:
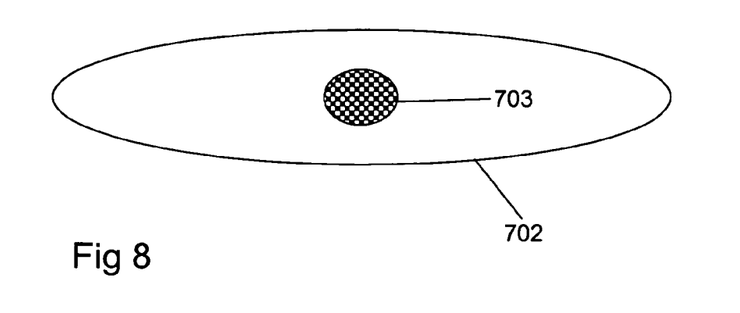

In FIG. 8 a depression 702 according to the invention is represented. This depression 702 is produced by the injection tool. In this embodiment the shape of the depression 702 is elliptical, following the shape of the finger or of the fingernail of a user. On the inside of the depression 702 an uneven area 703 is formed, by which the handling of the data carrier is further improved.

LIST OF REFERENCE NUMBERS 1 carrier band
  100 perforation
  101 upper side
  102 lower side
2 contact field
  200 contact area
  201 separating line
3 chip card body
  h height of the data carrier body
4 semiconductor circuit
5 electrical contacting between semiconductor circuit and contact areas
6 first potting compound
  600 potting compound mold
  601 second potting compound
7 injection channel
  700 ideal shape
  701 actual shape
  702 depression
  703 uneven area
8 flank angle
9 corner radius
10 punching tool
A-A' sectional line

The invention claimed is:

1. A method for manufacturing a portable data carrier having the method steps of:
making available a carrier band having an upper side and a lower side disposed opposite the upper side, wherein on the upper side a contact field is formed having at least one contact area;
arranging a semiconductor circuit on the lower side of the carrier band, wherein the semiconductor circuit is electroconductively connected with the corresponding contact area; and
executing a top gated injection molding process in that on the lower side a first potting compound is formed around the semiconductor circuit, wherein said first potting compound has the outer dimensions in accordance with a predetermined specification of a portable data carrier,
wherein the semiconductor circuit is encapsulated by a second potting compound before the injection molding process and wherein the first potting compound has improved flow properties from the second potting compound that provides ease in forming a depression and achieving a smaller corner radius and a steeper flank angle,
wherein after the injection of the potting compound a depression remains in the finished data carrier and is centered on a lower side of the data carrier body.

2. The method according to claim 1, wherein the data carrier is a subscriber identity module for use in a terminal as intended, and the depression is provided to make the handling of the subscriber identity module easier for a user of the subscriber identity module upon incorporation in the terminal and/or upon removal from the terminal.

3. The method according to claim 1, wherein the injection channel for injecting the first potting compound is centrally located on the side of the potting compound mold that is parallel to the lower side producing the depression.

4. The method according to claim 1, wherein uneven areas are contained in an inner region of the depression.

5. The method according to claim 1, wherein the carrier band is pre-punched in such a fashion that upon singling the data carriers less carrier band material is severed.

6. The method according to claim 1, wherein the data carrier is electrically personalized in a personalization unit before a singling step individualizing the data carrier.

7. The method according to claim 1, wherein the data carrier is optically personalized before a singling step.

8. The method according to claim 1, wherein the data carrier is singled by separating the portion of the carrier band that is connected with the potting compound from the rest of the carrier band.

9. The method of claim 1, wherein the depression is a central groove with uneven areas within the groove, the groove sized for a fingernail or corresponding object to remove the data carrier.

10. A portable data carrier for contact-type data exchange with a terminal, comprising:
a carrier band having an upper side and a lower side disposed opposite the upper side, wherein on the upper side a contact field is formed having at least one contact area;
a semiconductor circuit on the lower side, wherein the semiconductor circuit is electroconductively connected with the at least one contact area;

a data carrier body of a first potting compound material, wherein the first potting compound surrounds the semiconductor circuit and the potting compound has the outer dimensions according to a predetermined specification of a portable data carrier;

wherein the semiconductor circuit is encapsulated by a second potting compound before the injection molding process and wherein the first potting compound has improved flow properties from the second potting compound that provides ease in forming a depression and achieving a smaller corner radius and a steeper flank angle, wherein the finished data carrier body has a depression centrally located on a side that is parallel to the lower side.

11. The portable data carrier according to claim 10, wherein the depression has uneven areas in an inner region, wherein, despite the uneven areas, the data carrier body does not exceed the maximum height of the data carrier body described according to the predetermined specification.

12. The portable data carrier according to claim 10, wherein the first potting compound is of a material that differs from the second potting compound.

13. The portable data carrier according to claim 12, wherein the corner radius of the second potting compound is larger than the corner radius of the first potting compound.

14. The portable data carrier according to claim 12, wherein the flank angle of the second potting compound is larger than the flank angle of the first potting compound.

15. The employment of a data carrier according to claim 10 as a subscriber identity module for use in a terminal as intended.

* * * * *